United States Patent [19]

Doller

[11] Patent Number: 5,621,687

[45] Date of Patent: Apr. 15, 1997

[54] PROGRAMMABLE ERASURE AND PROGRAMMING TIME FOR A FLASH MEMORY

[75] Inventor: Edward M. Doller, El Dorado Hills, Calif.

[73] Assignee: Intel Corporation, Santa Clara, Calif.

[21] Appl. No.: 456,908

[22] Filed: May 31, 1995

[51] Int. Cl.$^6$ .................................................. G11C 7/00
[52] U.S. Cl. ........................ 365/185.29; 365/185.14; 365/185.22; 365/218; 365/236
[58] Field of Search ........................ 365/185.14, 185.19, 365/185.22, 185.29, 185.33, 189.07, 218, 236

[56] References Cited

U.S. PATENT DOCUMENTS

| | | | |
|---|---|---|---|
| 5,297,096 | 3/1994 | Terada et al. | 365/218 |
| 5,335,198 | 8/1994 | Van Buskirk et al. | 365/185.22 |
| 5,343,434 | 8/1994 | Noguchi | 365/185.22 X |

*Primary Examiner*—Son T. Dinh
*Attorney, Agent, or Firm*—Blakely, Sokoloff, Taylor & Zafman

[57] ABSTRACT

A method for controlling the programming and erasure time of a nonvolatile memory array in a memory device. A first value is defined, the first value representing a predetermined number of times a program or erase operation is to be reinitiated on the memory array. A write state machine of the memory device then initiates a program or erase operation on the nonvolatile memory array. The nonvolatile memory array is subsequently verified to determine if the program or erase operation was successful. If unsuccessful, the program or erase operation is repeated either until successful, or until the operation is repeated the predetermined number of times.

12 Claims, 4 Drawing Sheets

PROGRAMMABLE ERASURE AND PROGRAMMING TIME FOR A FLASH MEMORY

FIELD OF THE INVENTION

The present invention relates to the field of nonvolatile memory. More particularly, the present invention relates to a method of enabling the user of a nonvolatile memory device to control the programming or erasure time of a nonvolatile memory array.

BACKGROUND OF THE INVENTION

One type of prior nonvolatile memory is flash electrically erasable programmable read only memory (flash EEPROM, or "flash memory").

Flash memory combines erase features from prior nonvolatile memory types. Like prior electrically erasable programmable read only memory ("EEPROM"), flash memory is erased electrically without being removed from the computer system. Flash memory is also similar to erasable programmable read only memory ("EPROM") because flash memory is arranged in blocks such that the entire contents of each block must be erased at once. For an embodiment, a single flash memory array contains several individually-erasable blocks. Alternatively, a flash memory array comprises one block.

For one type of flash memory manufactured by Intel Corporation, an EPROM tunnel oxide ("ETOX") technology is used. The ETOX technology employs a single "floating gate" memory transistor to hold one bit of data. The programming of the memory transistor brings the value of the bit to a logical "0". Programming is accomplished by applying a large positive voltage to a select gate, applying a similar voltage to the drain, and grounding the source of the memory transistor. The select gate is positioned above the floating gate such that electrons are hot injected into the floating gate. Erasure of the flash memory brings the value of the bit to a logical "1". A large positive voltage is applied to the source of the memory transistor, causing electrons to be tunneled away from the floating gate.

As the memory transistor is repeatedly programmed and erased, "electron trapping" causes programming and erasure times to increase. During the programming of the transistor, electrons become trapped near the drain region, slowing electron hot injection in to the floating gate. Similarly erasure causes electrons to become trapped near the source region, making electron tunneling more difficult.

Electron trapping effects can cause programming and erasure operations to fail as the flash memory device ages. As a result, each program or erase operation is followed by a verification operation. Verification is performed by comparing the actual contents of the flash memory array with the intended program or erase value. If there is a discrepancy between the actual and intended values, the program or erase operation must be reinitiated. As the age of the flash memory array increases and electron trapping effects become more prevalent, the program or erase operation may have to be reinitiated a number of times. One type of Intel flash memory is qualified to withstand a minimum of 100,000 programming and erasure cycles before degradation or failure of programming and erasure times. This cycle lifetime is further extended to 1,000,000 cycles when flash memory devices incorporate wear-leveling algorithms that distribute data amongst flash memory blocks.

Prior flash memory devices that do not contain internal write control logic rely on the system microprocessor to sequence the flash memory through its program, erase, and verify steps. These devices have the disadvantage of placing a heavy burden on the microprocessor. However, they also have the advantage of allowing the microprocessor to control the number of times program and erase operations are reinitiated.

More recent flash memory devices developed by Intel Corporation have incorporated write state machines to help alleviate the heavy burden on the microprocessor. Upon receipt of a command from the microprocessor, the write state machine cycles the flash memory array through its program, erase, and verify steps automatically, reinitiating the program or erase steps as necessary. One drawback of these devices is that the microprocessor cannot access the flash memory array until either 1) the array verifies correctly, or 2) the write state machine "times out" after reinitiating the program or erase step a predetermined number of times. Because the time-out value is controlled internal to the flash memory device, the microprocessor has little control over the amount of wait time involved during programming and erasure.

In certain situations it is desirable for the microprocessor to be able to control the time-out value. One such situation arises when the flash memory device contains code for the microprocessor to execute. While one block of memory is being repeatedly erased and programmed, the microprocessor may need to wait to execute code out of another block. The microprocessor could decrease its wait time, and hence increase its efficiency, by setting a shorter time-out value for memory devices containing frequently-accessed code.

A controllable time-out value would also be desirable when the microprocessor needs to input large amounts of programming data to the flash memory device. Some Intel flash memory devices employ input buffers to allow data to be written to one buffer of the memory device while the flash memory array is being programmed out of a second buffer. The increased efficiency of this type of buffer arrangement is diminished by long time-out values that tie up the write state machine and cause the buffers to fill. By setting a short time-out value for a memory device that will be frequently programmed with a lot of data, the microprocessor can therefore increase the efficiency of its write cycles to the flash memory device.

SUMMARY AND OBJECTS OF THE INVENTION

It is an object of the invention to increase the efficiency of microprocessor read and write cycles to a nonvolatile memory device.

It is another object of the invention to enable a microprocessor to determine the time at which a nonvolatile memory device will return control to the microprocessor during a program or erase operation.

A method for controlling the programming and erasure time of a nonvolatile memory array of a memory device is described. A first value is defined, the first value representing a predetermined number of times a program or erase operation is to be reinitiated on the nonvolatile memory array. A write state machine then initiates a program or erase operation on the nonvolatile memory array. The nonvolatile memory array is subsequently verified to determine if the program or erase operation was successful. If unsuccessful, the program or erase operation is reinitiated either until successful or until the operation has been reinitiated the predetermined number of times.

Other features and advantages of the present invention will be apparent from the accompanying drawings and the detailed description that follows.

BRIEF DESCRIPTION OF THE DRAWINGS

The present invention is illustrated by way of example and not limitation in the figures of the accompanying drawings in which like references indicate similar elements and in which.

DETAILED DESCRIPTION

A memory device and method of controlling the erasure and programming time of a flash memory array is described. The method provides the user of a memory device with the ability to control the number of times an erase or program operation is reinitiated during the erasure or programming of a flash memory array.

Figure 1:
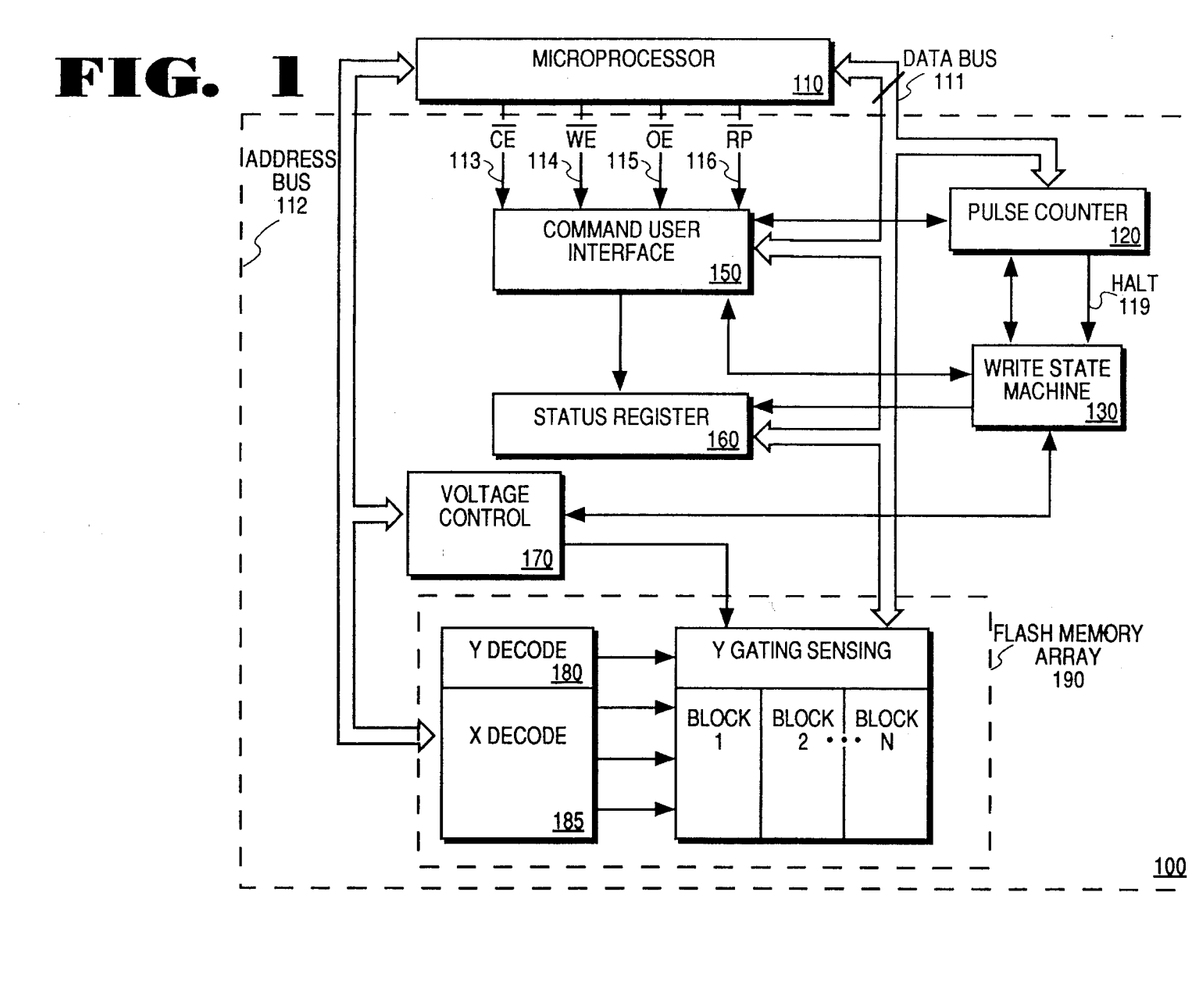
FIG. 1 is a block diagram of an embodiment of a flash memory device employing pulse counter circuitry.

FIG. 1 illustrates in block diagram form an embodiment of the present invention incorporated in a memory device 100. The memory device 100 is fabricated on a single semiconductor substrate.

Microprocessor 110 accesses the flash memory array 190 by asserting commands on data bus 111 and addresses on address bus 112. Memory device 100 is suitable for use in a variety of systems such as personal computers, electronic organizers, automobile control systems, and laser printers. Thus alternative embodiments of the microprocessor 110 include a microcontroller, a state machine, an application specific integrated circuit (ASIC), and other devices capable of controlling the memory device 100.

The memory device 100 communicates with the microprocessor 110 via the data bus 111, the address bus 112, and other pins coupled to the memory device 100. For the embodiment shown in FIG. 1, a bar over the pin name, e.g. $\overline{CE}$, indicates that the pin is active low. An active low pin is active when a logical zero signal is coupled to the pin, and inactive when a logical one signal is coupled to the pin.

The $\overline{CE}$ pin 113 is the chip enable pin which controls the power of the memory device 100. When the $\overline{CE}$ pin 113 is active, internal control and buffer circuits of memory device 100 are turned on. When $\overline{CE}$ pin 113 is inactive, the flash memory device is placed in a low power standby mode. For an alternative embodiment the memory device 100 includes more than one $\overline{CE}$ pin, such that when all $\overline{CE}$ pins are active the device 100 is selected. This embodiment is especially useful for large arrays comprising several memory devices.

The $\overline{OE}$ pin 115 is the output enable for the memory device 100. When the $\overline{OE}$ pin 115 and the $\overline{CE}$ pin 113 are both active, the outputs on the data bus 111 are gated to the microprocessor 100. The $\overline{WE}$ pin 114 is the write enable pin. The write enable pin controls the writes to the command user interface 150. When the $\overline{CE}$ pin 113 is active, the memory device 100 latches addresses and data on the rising edge of $\overline{WE}$. Standard microprocessor timings are used.

The $\overline{RP}$ pin 116 is the reset/power down pin. When the $\overline{R}$ pin 116 is active, the memory device 100 is placed in a sleep mode which consumes considerably less power than the standby mode. When the memory device 100 is in the sleep mode, the flash memory array 190 cannot be read from, programmed, or erased. When the $\overline{RP}$ pin 116 is pulled active, the write state machine 130 is reset and the flash memory device is placed in the sleep mode.

Flash memory array 190 is comprised of a number of blocks of flash memory cells. For another embodiment, the memory array 190 is comprised of only one block. During memory array accesses, the X decoder 180 receives the address from microprocessor 110 on address bus 112 and selects the appropriate row within the flash memory array 190. The Y decoder 185 similarly receives the address and selects the appropriate column within flash memory array 190.

The memory device 100 includes a write state machine 130 for performing "write" sequences, such as programming and erasure, on the flash memory array 190. The write state machine 130 performs program and erase sequences by controlling the voltages provided to the flash memory array 190 through the voltage control circuitry 170. One embodiment of the write state machine 130 comprises a microcontroller, using microcode to control the sequencing of the flash memory array 190 for erasure and programming. For another embodiment the write state machine 130 is a programmable logic array (PLA).

Command user interface 150 is the interface between the microprocessor 110 and the internal operation of the flash memory device. Commands are latched to the command user interface 150 from the microprocessor 110 via the data bus 111. The command user interface 150 decodes these commands and generates signals used by other circuits in the flash memory device. When the microprocessor 110 issues a read command, the command user interface 150 points the read to either the flash memory array 190 or status register 160. When the microprocessor 110 issues a program or erase command, the command user interface 150 signals the write state machine 130 to begin the correct sequence of steps.

The status register 160 reflects the status of the write state machine 130 during its operations. The status register 160 indicates to the microprocessor 110 (1) whether the write state machine 130 can accept another command, (2) whether the write state machine 130 has completed its current operation, and (3) whether the current operation was successful or unsuccessful. For an embodiment of the flash memory array 190 containing multiple blocks, the status register 160 also comprises separate block status registers that reflect the status for each separate block.

Erasure of a block of flash memory array 190 requires that high voltage be supplied to the memory transistors. In the absence of high voltage, the flash memory array defaults to the "read-only" mode. Voltage control circuitry 170 contains switches to supply the required voltage levels to the flash memory array 190 during read, program, and erase operations. The programming of a flash memory transistor is accomplished by applying 12 volts ("VPP") to the gate, 6 volts (VPP/2) to the drain, and grounding the source of the memory transistor. This process attracts electrons to the floating gate of the memory transistor by hot electron injection. The flash memory transistor is erased by applying VPP to the source, grounding the gate, and allowing the drain of the transistor to float. The electrons are thus removed from the floating gate by a mechanism called Fowler-Nordheim tunneling. Reading of a flash memory transistor is performed by applying 5 volts ("VCC") to the gate, grounding the source, and applying 1 volt to the drain. The amount of drain-source current $I_{DS}$ is then sensed to determine whether the transistor is in the programmed or erased state. For one embodiment, voltage control circuitry 170 also contains internal power circuits that supply the necessary voltages for operating the memory device 100 if the external supply levels are less than the required values.

During program and erase operations, VPP is supplied to the flash memory array in the form of a pulse. The pulse duration is set such that it minimizes the time required for programming and erasure and maximizes the memory transistor cycle lifetime. The write state machine 130 controls the application of pulses to the flash memory array 190 through the voltage control circuitry 170.

Subsequent to each program or erase operation, the data in the block being programmed or erased is verified. Program verification involves a data comparator (not shown) that compares the data of the programmed block with the input data intended to be programmed into the block. During the erase verify operation, the data comparator compares each address of the erased block with FFFFH. If either the program or erase verify operation indicates a discrepancy between the actual and intended values, the operation was unsuccessful. The write state machine 130 will then reinitiate a program or erase pulse until either 1) the attempt is successful, or 2) the write state machine 130 times out. The microprocessor 110 must wait until one of these two conditions occurs before regaining control of the memory device 100.

The microprocessor 110 can minimize this wait time by controlling the programming and erasure time-out interval. The microprocessor 110 accomplishes this by designating the maximum number of program or erase pulses to be delivered to the flash memory array 190 during one program or erase sequence. The write state machine 130 receives the maximum pulse value, and times out when a program or erase pulse has been reinitiated the maximum number of times. The microprocessor 110 can determine the time-out interval based upon the maximum number of program and erase pulses. Program and erase pulse durations are specific to the memory device 100, and are typically provided for in the device data sheet. Thus the time-out interval is equal to the maximum number of pulses multiplied by the duration of the program or erase pulse.

With current technologies, successful flash memory program times are 3 orders of magnitude slower than reads (10 microseconds for writes v. 100 nanoseconds for reads). Because of this relatively longer write time, a problem arises when the microprocessor 110 needs to read from another location (i.e. to service a read interrupt) in the flash array prior to completion of a successful program or erase.

The microprocessor 110 uses a two step method to input the maximum pulse value to the memory device 100. The microprocessor 110 first asserts a "set max pulse" command to the command user interface 150 on the data bus 111. The "set max pulse" command comprises a string of digital bits that is decoded by the command user interface 150. The command user interface then enables the pulse counter circuitry 120 to accept the maximum pulse value from the data bus 111. For the second step, the microprocessor 110 asserts data representing the maximum pulse value on the data bus 111. The pulse counter circuitry 120 receives and stores this maximum pulse value. For an alternative embodiment, the command user interface 150 requires a "set max pulse verify" command to immediately follow the "set max pulse" command. This requirement helps avoid an inadvertent modification of the maximum pulse value.

Figure 2A:
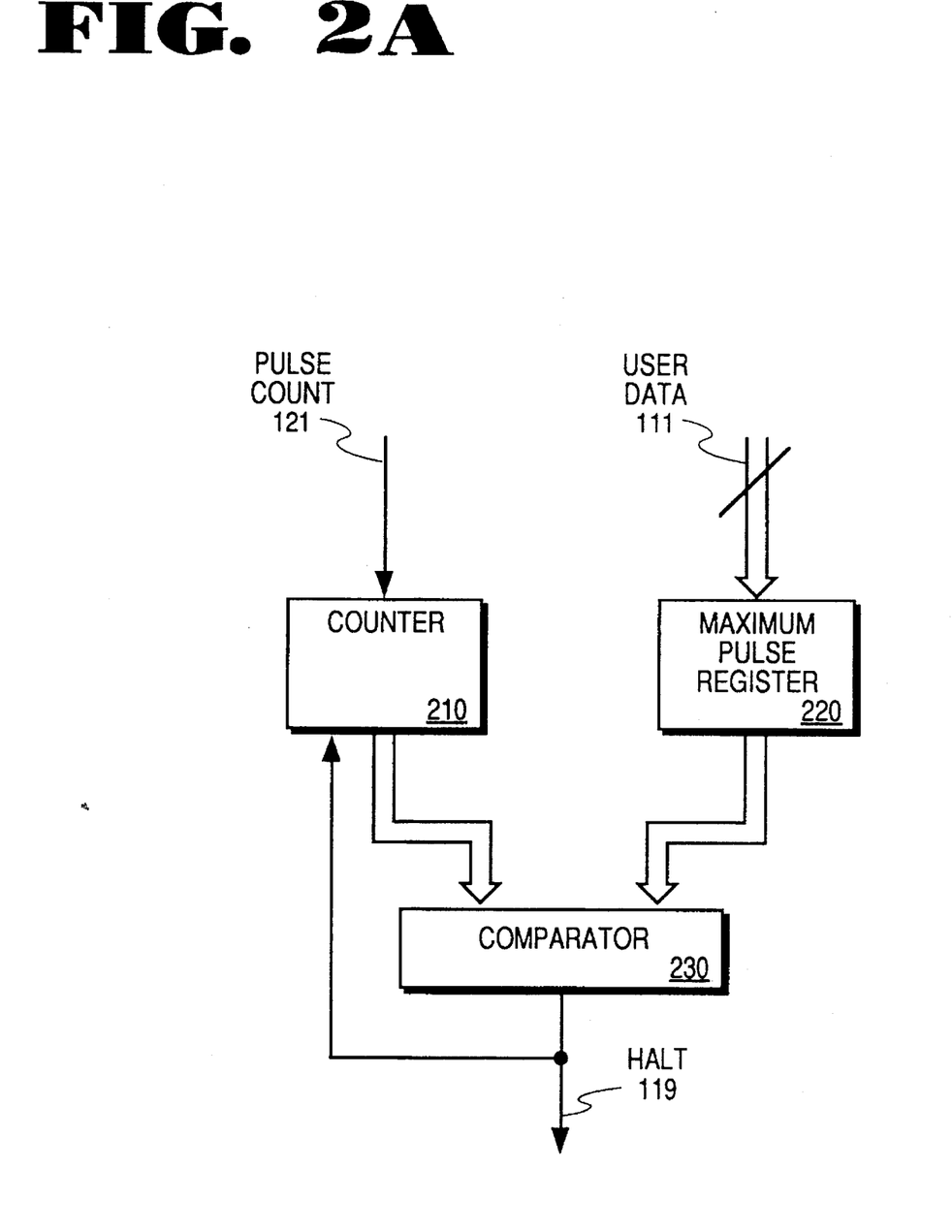
FIG. 2a is a block diagram representing one embodiment of pulse counter circuitry.

FIG. 2a illustrates in block diagram form one embodiment of the pulse counter 120. Maximum pulse register 220 stores the maximum number of pulses for time-out. For an embodiment, the maximum pulse register 220 is originally set to a default maximum pulse value until changed by the microprocessor 110. The maximum pulse value is loaded in to the maximum pulse register 220 over the data bus 111. Alternatively, the maximum pulse register 220 is not a separate register; instead the maximum pulse register 220 is a data storage area within a block of the flash memory array 190.

Each time a program or erase pulse is asserted, the write state machine 130 asserts an active signal on pulse count line 121. The pulse count line 121 is coupled to the counter 210. For one embodiment, the counter 210 is an incrementer that increments with each asynchronous assertion of a signal on the pulse count line 121.

Each time the counter 210 increments, the counter 210 value and the maximum pulse register 220 value are compared by the comparator 230. If the value of the counter 210 is equal to the maximum pulse value, the comparator 230 generates an active halt signal on line 119. The write state machine 130 receives the active halt signal 119 and as a result does not initiate another program or erase pulse. The write state machine 130 interrupts its current programming or erasure sequence and resets to its initial state. The status register 160 is updated to indicate to the microprocessor 110 that the programming or erasure was unsuccessfully completed.

If the comparator 230 indicates that the value of the maximum pulse register 220 and the value of the counter 210 are not equal, then no halt signal is generated. The write state machine 130 reinitiates the program or erase pulse as appropriate.

Figure 2B:
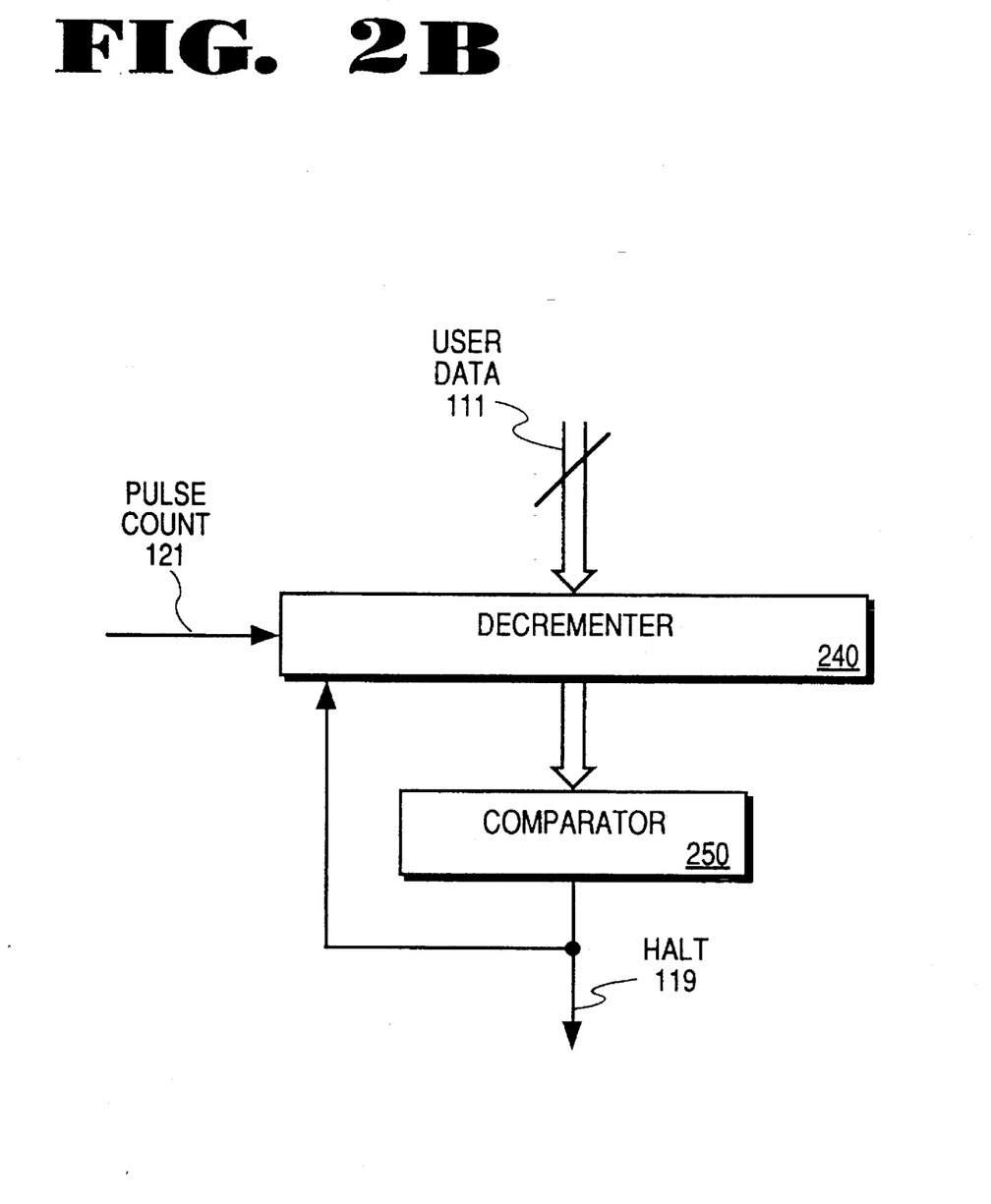
FIG. 2b is a block diagram representing another embodiment of pulse counter circuitry.

Another embodiment of the pulse counter is illustrated in FIG. 2b. The maximum pulse value is loaded in to a decrementer 240 over the data bus 111. For an embodiment, the maximum pulse value is originally set to a default value until the microprocessor 110 changes the default value.

The maximum pulse value is loaded in to the decrementer 240 by the microprocessor 110 before a programming or erasure sequence commences. For an alternative embodiment, the microprocessor 110 stores the maximum pulse value in a block of flash memory array 190. The maximum pulse value is then loaded in to the decrementer 240 from the block just before a program or erase sequence commences.

Each time the write state machine 130 issues a program or erase pulse, an active signal is asserted on pulse count line 121. Each assertion of the pulse count signal causes the decrementer 240 to decrement by one. Each time the decrementer 240 decrements, the comparator 250 compares the value of the decrementer 240 with zero. If the decrementer 240 value is equal to zero, an active halt signal on line 119 is sent to the write state machine 130. The write state machine 130 receives the active halt signal on line 119 and as a result does not initiate another a program or erase pulse. The write state machine 130 interrupts its current programming or erasure sequence and resets to its initial state. The status register 160 is updated to indicate to the microprocessor 110 that the programming or erasure was unsuccessfully completed.

If the comparator 250 determines that the decrementer 240 is not equal to zero, then a halt signal is not generated, and the write state machine 130 reinitiates the program or erase pulse as appropriate.

Figure 3:
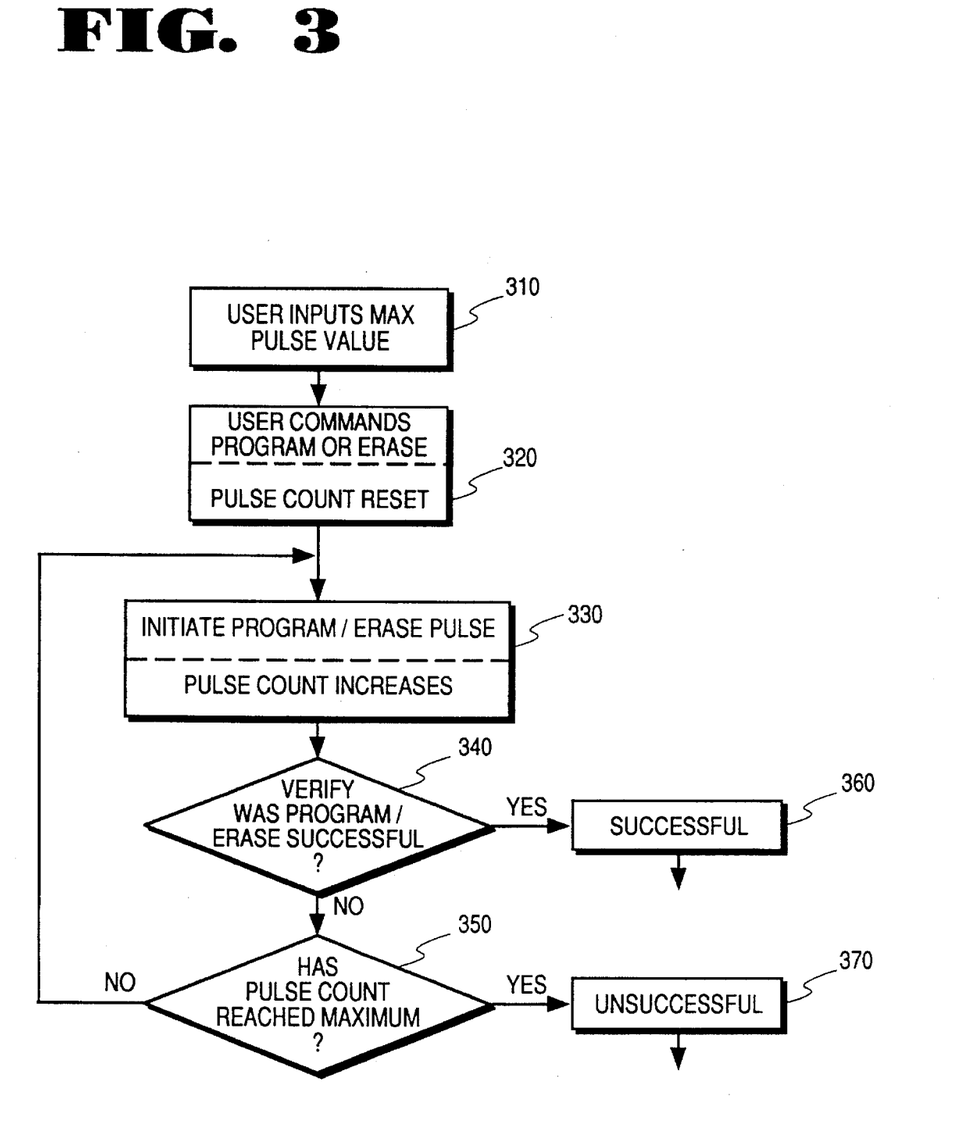
FIG. 3 is a flow diagram of a method of controlling a programming and erasure time of a flash memory array.

FIG. 3 is a flow diagram illustrating a method by which the microprocessor 110 may control the programming and erasure time of the flash memory array 190. The microprocessor 110 inputs the maximum pulse value at step 310. The microprocessor 110 asserts data representing the "set max pulse" command on the data bus 111, followed by data representing the maximum pulse value.

At some time following step 310, the microprocessor 110 asserts a program or erase command to the memory device 100. This is illustrated as step 320 in FIG. 3. The program or erase command is decoded by the command user interface 150, and the command user interface 150 resets the pulse counter 120 to its initial value. For the embodiment of the pulse counter 120 shown in FIG. 2a, counter 210 is reset to zero in step 320. For the embodiment of the pulse counter 120 shown in FIG. 2b, the decrementer 240 is reset to the maximum pulse value at step 320.

The write state machine 130 next delivers the first program or erase pulse to the flash memory array 190 at step 330. As the first program or erase pulse is initiated, the pulse counter 120 updates the "current pulse count value," a value representing the number of pulses that have been initiated during the current write state machine sequence. For the embodiment of the pulse counter 120 in FIG. 2a, the current pulse count value is stored in counter 210, and counter 210 increments by one at step 330. For the embodiment of the pulse counter 120 in FIG. 2b, the current pulse count value is stored in the decrementer 240, and the decrementer 240 is decremented by one at step 330.

Once the program or erase pulse of step 330 has completed, the write state machine 130 verifies a block of the flash memory array 190 at step 340. If the verify indicates a successful programming or erasure, the write state machine 130 resets to its initial state and the status register 160 is updated to indicate the successful completion.

If the write state machine 130 indicates the programming or erasure was unsuccessful at verify step 340, another program or erase pulse needs to be delivered. The write state machine 130 will only deliver another pulse, however, if the current pulse count value is not equal to the maximum pulse value. Hence at step 350 the comparator compares the current pulse count value with the maximum pulse value.

If the comparator indicates that the current pulse value equals the maximum pulse value at step 350, the write state machine 130 times out as is shown for step 370. The write state machine 130 thus resets to its initial value and the status register 160 is updated to indicate an unsuccessful completion of the programming or erasure.

If the comparator indicates that the current pulse value is not equal to the maximum pulse value at step 350, the operations of step 330 are invoked. The write state machine 130 therefore initiates another program or erase pulse, and the pulse counter 120 updates the current pulse count value.

The method of FIG. 3 has been explained with reference to the pulse counter circuitry 120 and the embodiments illustrated in FIGS. 2a and 2b. Alternatively, the method of FIG. 3 is performed by the write state machine 130, wherein the write state machine 130 comprises a microcontroller. The microcontroller is capable of reading from and writing to memory, and executing arithmetic instructions. For an embodiment of the microcontroller, the arithmetic instructions are performed by an arithmetic logic unit ("ALU"). The method of using a microcontroller to perform the steps of FIG. 3 will be described in more detail herein below.

The microcontroller receives the maximum pulse value at step 310, and stores it at a first address in memory. For step 320, the microcontroller writes an initial pulse count value to a second address in memory.

When the program or erase pulse in initiated at step 330, the microcontroller reads the pulse count value from the memory and incrementally changes the pulse count value by one. For one embodiment, the microcontroller increments the pulse count value by one. For an alternative embodiment, the microcontroller decrements the pulse count value by one. Other embodiments use the technique of incrementally changing the pulse count value by more than one upon each program or erase pulse.

The microcontroller verifies the block of the flash memory array 190 at step 340. The microcontroller performs the program verification by reading the contents of the block and comparing the contents to the intended programming data. An erase verification is performed by reading the contents of the block and comparing each bit of the contents with logical "1". If the verification performed at step 340 indicates a successful programming or erasure, the microcontroller updates the status register at step 360. If the verification performed at step 340 indicates an unsuccessful programming or erasure, the microcontroller executes the operations of step 350 by comparing the pulse count value in memory with the maximum pulse value. If the two values are not equal, the microcontroller branches back to perform the operations of step 330. If the two values are equal, the microcontroller updates the status register at step 0, and does not initiate another program or erase pulse.

For one embodiment, two separate maximum pulse values are used by the microcontroller for step 350. The first maximum pulse value corresponds to programming, and is therefore used at step 350 only when the microcontroller is performing programming pulses. The second maximum pulse value corresponds to erasure, and hence is used at step 350 when erase pulses are being performed.

Thus, in the foregoing detailed description a memory device and method of controlling the programming and erasure time of a flash memory array is described. The memory device employs a write state machine for automatically programming and erasing the flash memory array. The method provides the user of the memory device with the ability to control the number of times a program or erase operation is reinitiated during the automatic programming or erasure of the flash memory array.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method of programming and erasing a nonvolatile memory array of a memory device, the method comprising the steps of:

(a) determining a user-defined first value representing a predetermined number of times an operation is to be reinitiated on the nonvolatile memory array;

(b) setting a pulse counter value to an initial value;

(c) initiating the operation on the nonvolatile memory array and incrementally changing the pulse counter value, wherein the operation is a program operation or an erase operation performed by a write state machine of the memory device;

(d) verifying the nonvolatile memory array to determine if the operation was successful;

(e) repeating steps (b) and (c) if the operation was not successful until the pulse counter value is equal to the predetermined number of times.

2. The method of claim 1, wherein the nonvolatile memory array comprises a flash electrically erasable programmable read only memory.

3. A method of programming and erasing a nonvolatile memory array comprising the steps of:

(a) setting a pulse counter value to an initial value;

(b) incrementally changing the pulse counter value upon commencement of an operation on the nonvolatile memory array, wherein the operation is one of a program operation and an erase operation;

(c) verifying the nonvolatile memory array to determine if the operation was successful;

(d) comparing the pulse counter value with a final value upon a determination that the operation was not successful; and (e) repeating steps (b)–(d) unless the pulse counter value is equal to the final value.

4. The method of claim 3, wherein the final value is zero and step (b) further comprises the step of decrementing the pulse counter value by one.

5. The method of claim 3, wherein the initial value is zero and step (b) further comprises the step of incrementing the pulse counter value by one.

6. The method of claim 3, wherein the nonvolatile memory array comprises a flash electrically erasable programmable read only memory.

7. A method of programming and erasing a nonvolatile memory array comprising the steps of:

(a) setting a pulse counter value to an initial value;

(b) loading a final value in to a register;

(c) incrementing the pulse counter value upon commencement of an operation on the nonvolatile memory array, wherein the operation is one of a program operation and an erase operation;

(d) verifying the nonvolatile memory array to determine if the operation was successful;

(e) comparing the pulse counter value with the final value upon a determination that the operation was not successful; and (f) repeating steps (b)–(e) if the pulse counter value is less than the final value.

8. The method of claim 7, wherein the nonvolatile memory array comprises a flash electrically erasable programmable read only memory.

9. A memory device, comprising:

(a) a nonvolatile memory array;

(b) storage means for accepting a maximum pulse value from a user of the memory device;

(c) control means for performing an operation on the nonvolatile memory array and reinitiating the operation if the nonvolatile memory array was not successfully programmed, wherein the operation is one of a program operation and an erase operation;

(d) counter means for counting a number of operations performed by the control means;

(e) means for detecting when the number of program operations is equal to the maximum pulse value and subsequently preventing the control means from reinitiating the operation.

10. The memory device of claim 9, wherein the nonvolatile memory array is a flash electrically erasable programmable read only memory.

11. A method of programming and erasing a nonvolatile memory array of a memory device, the method comprising the steps of:

(a) receiving a max pulse command from a microprocessor;

(b) receiving a user-defined first value from said microprocessor, said user-defined first value representing a predetermined number of times an operation is to be reinitiated on the nonvolatile memory array;

(c) initiating the operation on the nonvolatile memory array, wherein the operation is a program operation or an erase operation performed by a write state machine of the memory device;

(d) verifying the nonvolatile memory array to determine if the operation was successful; and (e) repeating steps (b) and (c) if the operation was not successful until step (b) has been performed the predetermined number of times.

12. The method of claim 11, wherein step (b) further comprises the step of storing said user-defined first value in a register.

* * * * *

UNITED STATES PATENT AND TRADEMARK OFFICE
CERTIFICATE OF CORRECTION

PATENT NO.   : 5,621,687
DATED        : April 15, 1997
INVENTOR(S)  : Edward M. Doller It is certified that error appears in the above-identified patent and that said Letters Patent is hereby corrected as shown below:

In column 4 at line 4 delete "$\overline{R}$" and insert --$\overline{RP}$--

Signed and Sealed this

Twenty-second Day of July, 1997

Attest:

BRUCE LEHMAN

Attesting Officer

Commissioner of Patents and Trademarks